United States Patent [19]
Say

[11] Patent Number: 4,996,626
[45] Date of Patent: Feb. 26, 1991

[54] RESISTORLESS ELECTROSTATIC DISCHARGE PROTECTION DEVICE FOR HIGH SPEED INTEGRATED CIRCUITS

[75] Inventor: Quincy Say, Santa Clara, Calif.

[73] Assignee: National Semiconductor Corp., Santa Clara, Calif.

[21] Appl. No.: 257,756

[22] Filed: Oct. 14, 1988

[51] Int. Cl.$^5$ ............................................. H01L 27/02
[52] U.S. Cl. ..................................... 361/91; 361/212; 357/43; 357/23.13
[58] Field of Search ........................ 357/23.13, 41, 43; 361/91, 212

[56] References Cited

U.S. PATENT DOCUMENTS

| | | | |
|---|---|---|---|
| 4,692,834 | 9/1987 | Iwahashi et al. | 361/91 |
| 4,811,155 | 3/1989 | Kuriyama et al. | 357/25.13 |
| 4,829,350 | 5/1989 | Miller | 361/91 |
| 4,855,620 | 8/1989 | Duvvury et al. | 361/91 |

Primary Examiner—A. D. Pellinen
Assistant Examiner—Jeffrey A. Gaffin
Attorney, Agent, or Firm—Lee Patch; Gail Woodward; Michael Glenn

[57] ABSTRACT

An electrostatic discharge protection circuit without the use of a series resistor is described. MOSFET transistors with a turn-on voltage above the postive supply voltage but below the breakdown voltage are used. In one embodiment, parasitic bipolar transistors formed in conjunction with the MOSFETs are employed for further protection.

11 Claims, 2 Drawing Sheets

RESISTORLESS ELECTROSTATIC DISCHARGE PROTECTION DEVICE FOR HIGH SPEED INTEGRATED CIRCUITS

BACKGROUND OF THE INVENTION

This invention relates to protecting integrated circuits from damage from electrostatic discharge. In this invention the protection is accomplished without the use of a series resistor in the signal path, which makes this invention particularly suitable for high speed circuitry.

Electrostatic discharge (ESD) occurs when large voltage pulses due to static electricity occur at the leads of an integrated circuit (IC). These large voltage pulses can cause the breakdown of insulating layers, short circuiting between conducting paths, or overheating or evaporation of metal or silicon pathways within the IC, leading to failure of the IC. With increased density ICs, the reduction in the width of lines and insulating spaces within the ICs has made them more susceptible to damage from ESD. Emphasis on increased reliability has required the addition of ESD protection circuitry to the input and output pins of ICs. FIG. 1 shows one form of ESD protection circuit known in the art. An input pin 10 is connected through a series resistor 12 of value R to an internal signal line 14. The internal signal line 14 connects to the protected circuit of the IC. A first diode 16 has its anode connected to the internal signal line 14, and its cathode connected to a supply line to the positive supply voltage $V_{DD}$, typically +5 volts. A second diode 18 has its cathode connected to the internal signal line 14, and its anode connected to a ground line to the ground or supply reference point $V_{SS}$. An input voltage $V_{IN}$ on input pin 10 will travel through series resistor 12 to the internal signal line 14 and to the protected circuit of the IC.

The series resistor 12 serves three purposes. It limits the amount of current that can be drawn, protecting the diodes from excessive current. It also delays the rise of sharp voltage pulses by introducting R-C type delay on the signal line. The series resistor also acts as part of a voltage divider to reduce the voltage appearing on the internal signal line 14.

FIG. 2 shows the input current IIN vs. input voltage $V_{IN}$ characteristics of the protection circuit of FIG. 1. In the normal operating region 20, no diode conduction occurs and input signals are passed from input pin 10 through the series resistor 12 to the internal signal line 14 to the protected circuit. In the over voltage region 22, when the input voltage $V_{IN}$ is above the positive supply voltage $V_{DD}$ by more than one diode voltage drop $V_{be}$, diode 16 will be forward biased and conduct, drawing input current $I_{IN}$ limited by the value R of the series resistor 12. In the negative voltage region 24, when the input voltage $V_{IN}$ is below, or negative with respect to, the ground or supply reference point $V_{SS}$ by more than one diode voltage drop $V_{be}$, diode 18 will be forward biased and conduct, drawing input current $I_{IN}$ limited by the value R of the series resistor 12. In this manner excessive positive or negative input voltages are dissipated by input current $I_{IN}$ to the positive supply voltage $V_{DD}$ or ground $V_{SS}$. For a typical positive supply voltage $V_{DD}$ of 5.0 volts and a diode voltage drop $V_{be}$ of 0.6 volts, conduction will begin in the over voltage region 22 at $V_{DD}+V_{be}$ or $5.0+0.6=5.6$ volts. Conduction will begin in the negative voltage region 24 at $-V_{b3}$ or $-0.6$ volts.

Tolerance to ESD is typically measured by charging a 100 picofarad capacitor to a high voltage and then connecting the capacitor through a 1.5 K ohm resistor to the various pins of the IC. The protection circuit of FIG. 1 is adequate for ESD voltages up to 800 volts positive or negative. However, protection up to 2000 volts and above is desired, and the protection circuit of FIG. 1 has several disadvantages.

First, the use of a series resistor 12 in the signal path reduces the maximum rate of signal change possible for signals on the signal path from the input pin 10 to the protected circuit, due to R-C type delays as the series resistor 12 interacts with the input capacitance of the protected circuit and the stray capacitance of the IC packaging and silicon die. A protection circuit without the use of a series resistor is desired to allow protection of high speed circuits.

Second, the series resistor 12 limits the amount of input current $I_{IN}$ that can be drawn to dissipate very large input voltages. A protection circuit without a series resistor would draw a larger input current and provide greater dissipation of very large input voltages.

Third, current through the ESD protection diodes 16 and 18 begins at input voltage levels just one diode voltage drop $V_{be}$ above the positive supply voltage $V_{DD}$, at about 5.6 volts, whereas protection is not required until the input voltage approaches the breakdown voltage BV of the protected circuit, typically 20–30 volts for MOS circuitry or 30–50 volts for bipolar circuitry. Input current $I_{IN}$ in the interim voltage range of 5.6 to 20 volts is wasteful and creates undesirable heat buildup. A protection circuit without input current until approaching the level of the breakdown voltage is desired to reduce power dissipation and reduce heat buildup.

Finally, where the diodes are fabricated into the same silicon substrate as other circuitry, they must be spaced away from the other circuitry or be surrounded by guard bands to prevent minority carriers injected into the substrate by the diodes from affecting the operation of the other circuitry. A protection circuit that can be fabricated in a smaller area without affecting other circuitry is desired.

SUMMARY OF THE INVENTION

In this invention as shown in FIG. 3, the input pin 10 is connected by internal signal line 14 to the protected circuit without the use of a series resistor. Two insulated gate field effect transistors such as two MOSFETs 30 and 32 are fabricated with a high turn-on threshold voltage $V_t$ approaching the breakdown voltage BV of the protected circuit. Therefore, in the normal operating range of input voltages the MOSFETs will be non-conducting and have no effect on the internal signal line or the following protected circuit. At higher input voltages the MOSFETs will conduct to dissipate excessive voltage to the supply line or ground line before the breakdown voltage of the protected circuit is reached.

In a preferred embodiment of this invention parasitic bipolar transistors 34 and 36 are formed underlying and connected in parallel with the MOSFETs. These parasitic bipolar transistors provide additional ESD protection by avalanche and bipolar transistor second breakdown, creating additional parallel conduction paths to dissipate the ESD voltage.

By this invention, protection is generally effective for ESD voltages up to 2,000 volts and above positive or negative. No series resistor is required to limit current or delay input signals. The turn-on threshold voltage of the MOSFETs can be tailored to avoid undesireable current until approaching the breakdown voltage. Fabrication of the preferred embodiment in a single well reduces the injection of minority carriers that could disturb other circuitry. These and other advantages will be apparent to a person skilled in the art from a consideration of the following drawings and detailed description of the preferred embodiments.

BRIEF DESCRIPTION OF THE DRAWINGS FIG. 1 is a schematic diagram of a protection circuit known in the art.

DESCRIPTION OF THE PREFERRED EMBODIMENTS

Figure 3:
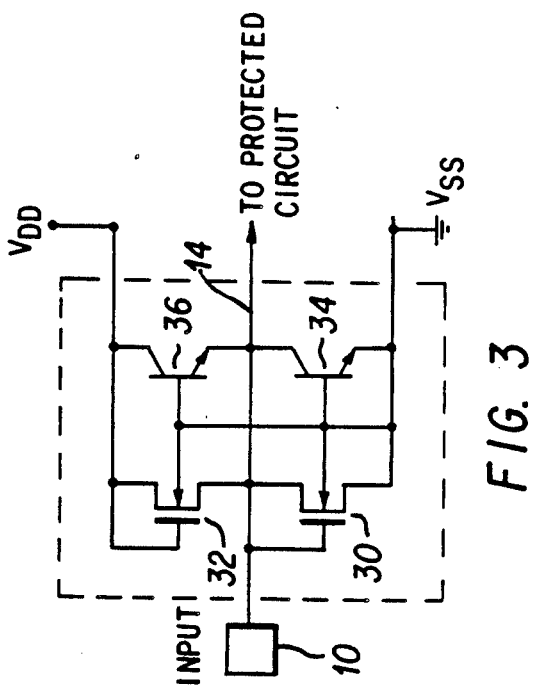
FIG. 3 is a schematic diagram of the resistorless ESD protection circuit of this invention.

In this invention as shown in FIG. 3, the input pin 10 is connected to the protected circuit by internal signal line 14 without a series resistor. A first MOSFET 30 has its gate and drain connected to internal signal line 14, and its source connected to ground $V_{SS}$. A second MOSFET 32 has its gate and drain connected to the positive supply voltage $V_{DD}$, and its source connected to internal signal line 14. The MOSFETs are fabricated with a high turn-on threshold voltage $V_t$ above the normal operating range but below the breakdown voltage BV of the protected circuit. For example, for a circuit with supply voltage $V_{DD}$ of 5.0 volts and a breakdown voltage BV of 20 volts, the turn-on threshold voltage Vt can be placed within the range of 5.0–20 volts. The exact point within this range can be tailored to avoid undesirable current until approaching the breakdown voltage, to provide a greater margin of safety by conducting well below the breakdown voltage, or to account for variations in the manufacturing process. For example, a turn-on threshold of 13 volts can be used. The turn-on threshold voltage $V_t$ can be tailored by use of thick oxide under the gate or other known MOS processing techniques.

An input voltage $V_{IN}$ on input pin 10 will travel past the MOSFET connections on internal signal line 14 to the protected circuit. An input voltage $V_{IN}$ above the turn-on threshold voltage $V_t$ will turn on the first MOSFET 30 to form a conductive path to ground $V_{SS}$. An input voltage $V_{IN}$ negative enough to fall more than a turn-on threshold voltage $V_t$ with respect to the positive voltage supply $V_{DD}$ pin will turn on the second MOSFET 32 to form a conductive path to the positive supply $V_{DD}$ pin.

In a preferred embodiment of this invention, parasitic bipolar transistors 34 and 36 are formed underlying and connected in parallel with the MOSFETs. These parasitic bipolar transistors provide additional ESD protection by avalanche and bipolar transistor second breakdown, creating additional parallel conduction paths to dissipate the ESD voltage.

In this preferred embodiment a first npn bipolar transistor is formed in conjunction with first MOSFET 30. The first bipolar transistor 34 has an emitter and base connected to ground $V_{SS}$, and a collector connected to internal signal line 14. A second npn bipolar transistor 36 is formed in conjunction with second MOSFET 32. The second bipolar transistor 36 has a collector connected to the positive supply voltage $V_{DD}$, a base connected to ground $V_{SS}$, and an emitter connected to internal signal line 14.

Figure 2:
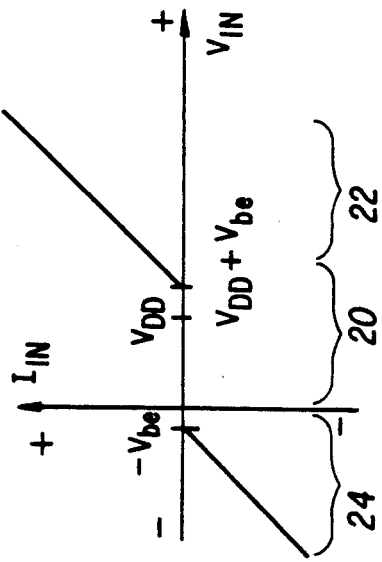
FIG. 2 is a graph of the current vs. voltage characteristics of the protection circuit of FIG. 1.
Figure 4:
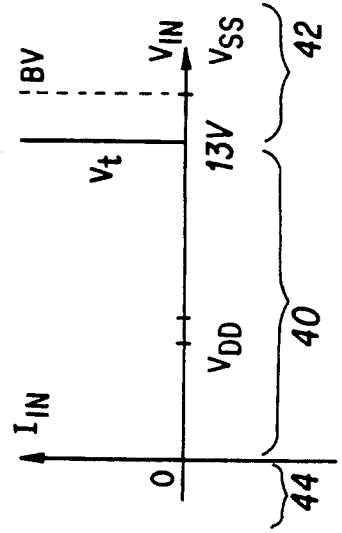
FIG. 4 is a graph of the current vs. voltage characteristics of the resistorless ESD protection circuit of a preferred embodiment of this invention.
Figure 1:
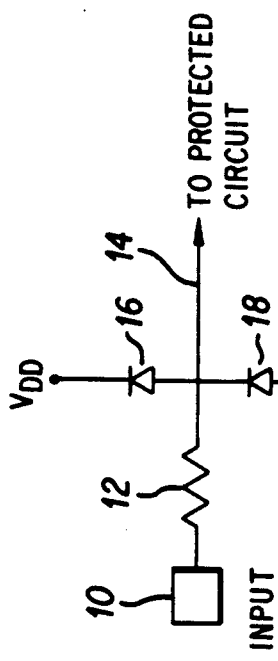

FIG. 4 shows the input current $I_{IN}$ vs. input voltage $V_{IN}$ characteristics of the protection circuit of this preferred embodiment. In the normal operating region 40, neither MOSFET and neither bipolar transistor will be conducting.

In the over voltage region 42, where the input voltage is above the MOSFET turn-on threshold voltage $V_t$, the first MOSFET 30 will turn on and conduct. The underlying bipolar transistor 34 will conduct due to avalanche and bipolar transistor second breakdown. By these conduction means, parallel conduction paths to ground $V_{SS}$ will be formed to dissipate the ESD voltage. If the over voltage occurs between the input pin and the positive supply $V_{DD}$ pin rather than referenced to ground $V_{SS}$, MOSFET 30 turns on; bipolar transistor 34 conducts due to avalanche and bipolar transistor second breakdown; and bipolar transistor 36 conducts as a diode from its base to $V_{DD}$ pin.

In the negative voltage region 44, when a negative voltage is applied to input pin 10, the first bipolar transistor 34 will conduct as a diode in forward bias. If the negative voltage occurs between the input pin and the positive supply $V_{DD}$ rather than referenced to ground $V_{SS}$, second MOSFET 32 will conduct, and the underlying bipolar transistor 36 will conduct due to avalanche and bipolar transistor second breakdown.

Therefore, both the conduction of the MOSFETs and the conduction of the bipolar transistors work together to dissipate ESD voltages.

Because no series resistor is used, a large input current $I_{IN}$ can be drawn, which more effectively discharges the excess input voltage.

Figure 5:
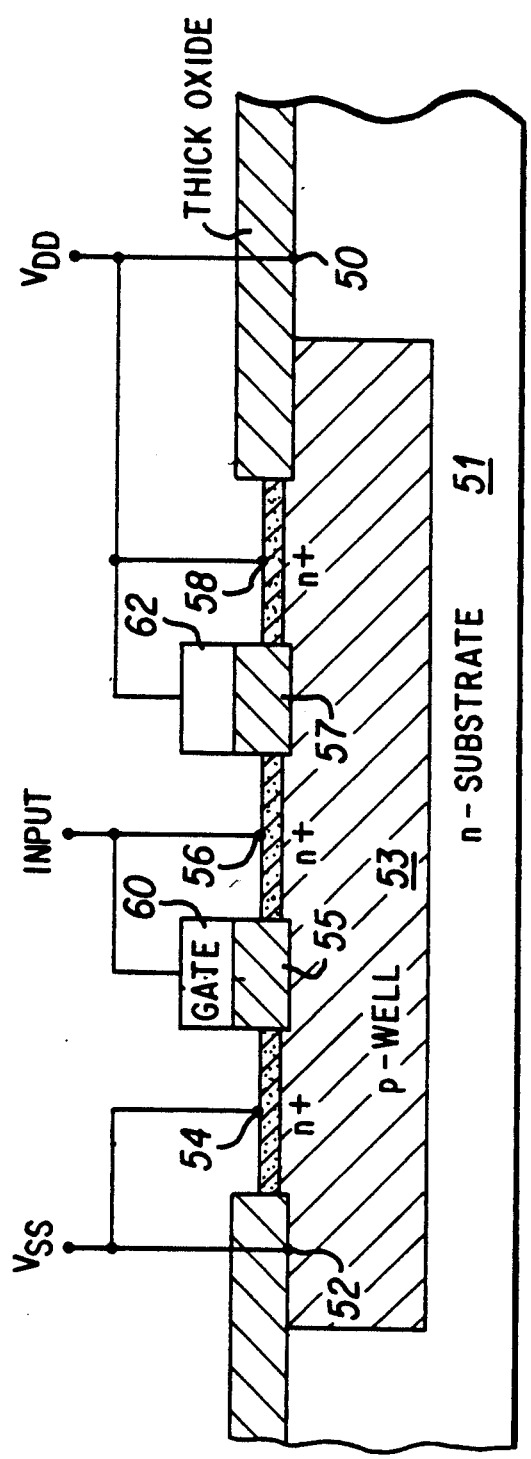
FIG. 5 is a cross section diagram of a semiconductor wafer showing a fabrication of a preferred embodiment of this invention.

FIG. 5 shows a cross section diagram of a semiconductor wafer showing a preferred fabrication of this invention corresponding to the circuitry and numbering of FIG. 3.

A p-well 53 is formed in an n-type substrate 51. A substrate contact 50 is connected to the positive supply voltage $V_{DD}$. A p-well contact 52 is connected to ground $V_{SS}$. The p-well contact 52 will also serve as the base connection for first bipolar transistor 34 and second bipolar transistor 36. Three n+ regions 54, 56, 58 are formed in the p-well 53. A first n+ region 54 is connected to ground $V_{SS}$ and serves as the emitter electrode for the first bipolar transistor 34 and as the source electrode for first MOSFET 30. Between first n+ region 54 and second n+ region 56 is formed a thick oxide 55 topped by the gate electrode 60 for the first MOSFET 30. The gate electrode 60 and the second n+ region 56 are connected to the internal signal line 14. The second n+ region 56 will serve as the drain electrode for first MOSFET 30, collector electrode for the first bipolar transistor 34, as an emitter electrode for second bipolar transistor 36, and as source electrode for second MOSFET 32. Between second n+ region 56 and third n+ region 58 is formed a thick oxide topped by the gate electrode 62 for the second MOSFET 32. The gate electrode 62 and the third n+region 58 are connected to the positive supply voltage $V_{DD}$. The third n+ region 58 will serve as the drain electrode for second MOSFET 32 and collector electrode for the second bipolar transistor 36. In operation; the source, drain, and gate electrodes of the first MOSFET 30 are formed respectively of FIG. 5 elements 54, 56 and 60. The source, drain and gate electrodes of the second MOSFET 32 are formed respectively of elements 56, 58 and 62. The emitter, collector and base electrodes of the first bipolar transistor 34 are formed respectively of FIG. 5 elements 54, 56 and 52. The emitter, collector and base electrodes of the second bipolar transistor 36 are formed respectively of elements 56, 58 and 52.

Although not limiting to the invention, by fabrication within a single p-well, the protection circuit of the present invention is conveniently isolated from other circuitry on the substrate, and the effects from injection of minority carriers are minimized.

Other embodiments of the resistorless ESD protection circuit of this invention should be apparent to one skilled in the art from a consideration of this specification. This invention can be used on output pins of an IC as well as on inputs. The circuit can be combined with other ESD protection circuits known in the art. The threshold voltage $V_t$ of the MOSFETs can be altered to change the point at which conduction occurs. A complementary embodiment in an n-well can be fabricated substituting p channel MOSFETS for n channel MOSFETS and reversing the voltage polarities. Other arrangements of electrical connections and other fabrication layouts can be used without departing from the scope of the invention, which is intended to be limited only by the following claims.

I claim:

1. An electrostatic discharge protection circuit for an integrated circuit containing a signal line, supply line and ground line compfising:
    first and second MOS transistors each with gate, drain and source terminals; wherein
    said first MOS transistor gate and drain terminals are connected to said signal line, and said source terminal is connected to said ground line; and
    said second MOS transistor gate and drain terminals are connected to said supply line, and said source terminal is connected to said signal line.

2. The circuit of claim 1 wherein said first and second MOS transistors have their gate terminals fabricated upon a selectively adjustable layer of oxide, thereby selectively tailoring the turn-on threshold voltage of said first and second MOS transistors.

3. An electrostatic discharge protection circuit for an integrated circuit containing a signal line, supply line and ground line comprising:
    first and second MOS transistors each with gate, drain and source terminals;
    first and second bipolar transistors formed common to said first and second MOS transistors, each with a collector terminal common to said drain terminal and an emitter terminal common to said source terminal, and connected base terminals;
    said first gate, drain and collector terminals connected to said signal line;
    said first gate, drain and collector terminals connected to said supply line;
    said second source and emitter terminals connected to said signal line; and
    said first and second base terminals connected to said ground line.

4. The circuit of claim 3 wherein first and second MOS transistors are n channel devices fabricated in a common p-well substrate.

5. The circuit of claim 3 wherein first and second MOS transistors have their gate terminals fabricated upon thick oxide, thereby raising the turn-on threshold voltage.

6. An electrostatic discharge protection circuit for an integrated circuit containing a signal line, supply line and ground line comprising:
    a first conductivity well formed in an opposite conductivity substrate;
    first and second insulated gate field effect transistors with gate, drain and source electrodes formed in said well; wherein
    said ground line is connected to said well and said first source electrode;
    said supply line is connected to said substrate, said second drain electrode and said second gate electrode; and
    said signal line is connected to said first drain electrode, said first gate electrode, and said second source electrode.

7. The circuit of claim 6 wherein said well is of p type conductivity, said substrate is of n type conductivity, and said first and second insulated gate field effect transistors are of n-channel type.

8. The circuit of claim 6 wherein said first and second insulated gate field effect transistors have said gate electrodes fabricated upon thick oxide, thereby raising the turn-on threshold voltage.

9. The circuit of claim 6 further comprising first and second parasitic bipolar transistors with emitter electrodes common to said source electrodes, collector electrodes common to said drain electrodes, and base electrodes common to said well.

10. An electrostatic discharge protection structure for an integrated circuit containing a signal line, supply line, and ground line comprising:
    an n-type substrate;
    a p-well formed in said n-type substrate;
    first, second and third n-type regions formed in said p-well;
    a first n-channel field effect transistor formed between said first and second n-type regions by a thick oxide coating and gate electrode;
    a second n-channel field effect transistor formed between said second and third n-type regions by a thick oxide coating and gate electrode;
    said ground line is contacting said p-well and said first n-type region;
    said signal line is contacting said first n-channel field effect transistor gate electrode and said second n-type region; and
    said supply line is contacting said second n-channel field effect transistor gate electrode, said third n-type region and said n-type substrate.

11. A structure of claim 10 further comprising: a first parasitic bipolar transistor formed by said first n-type region, said well and said second n-type region; and
    a second parasitic bipolar transistor formed by said second n-type region, said well and said third n-type region.

* * * * *